United States Patent

[11] 3,609,580

[72] Inventors Francis T. Thompson
Murrysville;
Bruce R. Dow, Delmont, both of Pa.

[21] Appl. No. 876,774
[22] Filed Nov. 14, 1969
[45] Patented Sept. 28, 1971
[73] Assignee Westinghouse Electric Corporation
Pittsburgh, Pa.

[54] ELECTRICAL SENSING APPARATUS
11 Claims, 5 Drawing Figs.

[52] U.S. Cl. .......... 331/65, 324/34 D, 324/34 E, 331/109, 331/117
[51] Int. Cl. .......... G01r 33/12
[50] Field of Search .......... 324/34, 41; 331/65, 117

[56] References Cited
UNITED STATES PATENTS
3,521,158 7/1970 Morrow et al. .......... 324/34

*Primary Examiner*—John Kominski
*Attorneys*—F. H. Henson, R. G. Brodahl and E. F. Possessky

ABSTRACT: Electrical sensing apparatus such as proximity detectors and vibration pickups of the type in which the instantaneous displacement between an inductor in the tank circuit of an oscillator and a conductive object in the field of the inductor is reflected in the output amplitude of the oscillator as a function of the "Q" of the tank circuit. The oscillator incorporates a low frequency, essentially direct current negative feedback path which, in conjunction with high loop gain at oscillation frequencies, insures that the circuit will oscillate under low "Q" conditions when the inductor is closely adjacent a conductive object.

ELECTRICAL SENSING APPARATUS

BACKGROUND OF THE INVENTION

In the past, electrical sensing devices have been provided comprising an electrical oscillator having a tank circuit including an inductive element, characterized in that the amplitude of the oscillations produced by the oscillator is a function of the displacement between the tank circuit inductive element and a conductive object in the field of the inductive element. Such devices operate on the eddy current principle, the output of the oscillator being a function of the radiated energy absorbed by the conductive object in the field of the inductance. As will be understood, this absorbed energy is, in turn, a function of the distance between the inductance and a conductive object; and as the distance between the object and the inductance decreases, so also does the "Q" of the oscillator tank circuit. Consequently, such devices can be used as proximity detectors or as pickups for vibration analyzing apparatus.

In a case of a proximity detector, a change in the output of the oscillator occurs when a conductive object comes within the field of the tank circuit inductance, which is usually incorporated into a compact sensing head or probe. The output change in amplitude due to the presence of a conductive object normally activates a suitable relay.

The use of such a device as a vibration pickup operates on somewhat the same principle, except that the output of the oscillator is utilized to produce a sinusoidal signal resulting from the oscillatory vibrational movement of a conductive member relative to a stationary inductive pickup. Consider, for instance, any rotating shaft housed within a bearing. Due to unbalance or eccentricity, the shaft will oscillate in a plane normal to its axis of rotation. Consequently, by mounting an inductive proximity pickup in a bearing for the shaft such that the periphery of the shaft is in the inductive field for the pickup, the output of the oscillator to which the pickup is connected can be rectified and used to generate a sinusoidal vibrational signal for vibration analyzing purposes.

One difficulty encountered with prior art inductive pickups of this type is the nonlinearity in the output signal caused by the dependence of the coil excitation signal on the output signal amplitude. This must be eliminated to obtain an analog output voltage truly proportional to "Q". Furthermore, when the distance between the inductive pickup and a metallic object was reduced to a small value in prior art devices, the feedback signal became inadequate and oscillation ceased. Oscillations would not resume until the distance was increased, at which time the output would jump to a higher level.

SUMMARY OF THE INVENTION

As an overall object, the present invention seeks to provide new and improved electrical sensing apparatus of the type described which overcomes the aforesaid difficulties encountered with prior art circuits.

More specifically, an object of the invention is to provide electrical sensing apparatus employing a radiofrequency tuned circuit wherein the output of the device is truly proportional to the "Q" of an inductive pickup assembly and, hence, truly proportional to the distance between the inductive pickup and a conductive object.

Another object of the invention is to provide electrical sensing apparatus of the type having an inductive pickup in the tank circuit of an oscillator, and incorporating a low frequency, essentially direct current, negative feedback path for the oscillator whereby the output signal from the sensing apparatus is truly linear and the system will oscillate even when the distance between the inductive pickup and an adjacent conductive object is extremely small.

In accordance with the invention, electrical sensing apparatus is provided comprising an oscillatory circuit incorporating an amplifying device together with a positive feedback path for the amplifying device which includes a tuned circuit having an inductance adapted to be placed in close proximity to a conductive object whose distance from the inductance is to be determined. In addition to the aforesaid positive feedback path, a low frequency, essentially direct current negative feedback path is provided for the amplifying device to insure that the amplifying device will be in the linear region and will support oscillations in response to low amplitude transient disturbances which will occur when the inductance is closely adjacent a conductive object and the "Q" of the tuned circuit is low. In this manner, the output of the sensing apparatus will vary in direct proportion to the distance between the inductance and a metallic object, even at extremely narrow spacings.

Further, in accordance with the invention, the tuned circuit of the oscillator is excited by a constant amplitude current source whereby the voltage across the inductance in the tuned circuit will at all times be proportional to the "Q" of the tuned circuit and, hence, the distance between the inductance and a conductive object. This helps to improve the linearity at the output of the electrical sensing apparatus.

The above and other objects and features of the invention will become apparent from the following detailed description taken in connection with the accompanying drawings which form a part of this specification, and in which.

Figure 1:
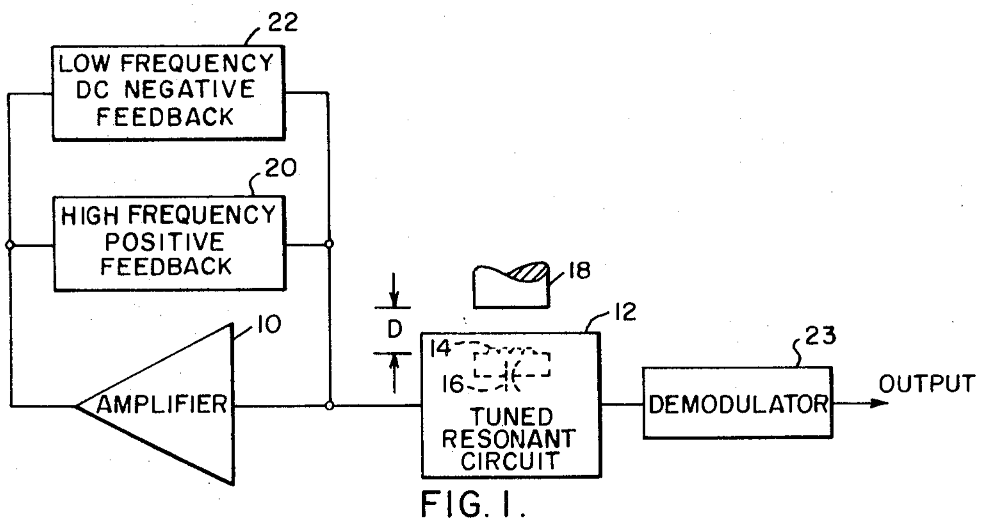
FIG. 1 is a block diagram of the electrical sensing apparatus of the invention.

With reference now to the drawings, and particularly to FIG. 1, the system shown includes an amplifying device 10 connected to a tuned resonant circuit 12 including an inductor 14 in parallel with a capacitor 16. Inductor 14, as will hereinafter be explained in detail, is ordinarily incorporated into a compact sensing probe and placed in relatively close proximity to an electrically conductive object 18 whose distance D from the inductor is to be determined. The amplifier 10 is provided with a high-frequency positive feedback path 20 to provide an oscillator configuration incorporating the tank circuit 12. Amplifier 10 also includes a low frequency, essentially direct current, negative feedback path 22 for the purpose of insuring that the system will oscillate even at small distances D between the object 18 and the coil 14 when the quality factor, Q, of the tank circuit 12 is very low.

With the arrangement shown, oscillations will be produced by the system, the amplitude of the oscillations being a function of the distance D. These oscillations are then rectified or demodulated in demodulator 23 to produce an essentially direct current output which varies as a function of D. If the distance D is varying, so also will the direct current output. If it is assumed, for example, that the object 18 is a rotating shaft and that the inductive pickup 14 is placed adjacent the shaft, vibrations in the shaft will cause the amplitude of the oscillations to vary in sinusoidal manner, whereby the output of the demodulator 23 wild be a sinusoidal direct current signal.

Figure 2:
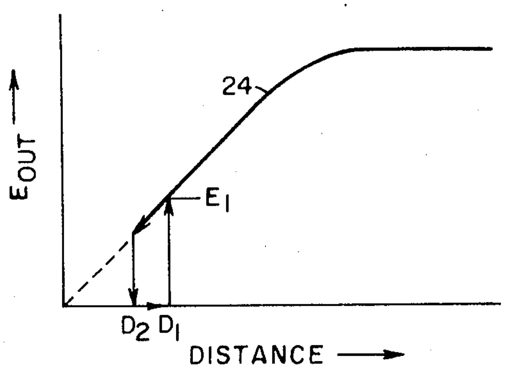
FIG. 2 is a graph of output voltage versus distance between an inductance and a metallic object for the circuit of FIG. 1, illustrating the characteristic for prior art circuits as well as the ideal characteristic of the circuit of the present invention.

As was mentioned above, a particular problem in prior art circuits of this type resides in the fact that when the distance between the inductive pickup 14 and the conductive object 18 is reduced to a small value, the feedback signal to the amplifier 10 from the positive feedback path 20 is reduced to a value such that the oscillations cease. This is shown in FIG. 2. Assuming that the coil 14 is extremely close to the object 18, it would not begin to oscillate until the distance increased to the value $D_1$. At this point, oscillations would begin and the output would jump to the value $E_1$, whereupon a further increase in the distance would cause the output to increase linearly along the curve 24. Similarly, as the distance between the pickup coil 14 and object 18 decreased under oscillating conditions, such oscillations would cease at a distance $D_2$ since the feedback signal becomes inadequate to support oscillations.

Figure 3:
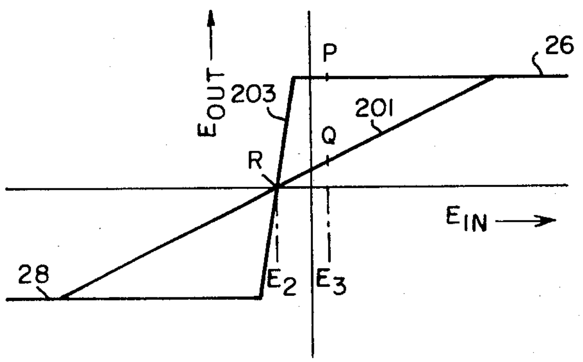
FIG. 3 illustrates the transfer characteristic of the amplifying device used in the oscillator of FIG. 1.

The foregoing can perhaps best be explained by reference to FIG. 3 showing a typical transfer characteristic of an amplifying device. The amplifying device typically would have a linear region, as shown by curve 201, wherein the output increases or decreases with a change in input signal, and regions of saturation 26 and 28. A direct current offset voltage of the amplifier $E_2$ and a direct current signal voltage offset $E_3$ are shown in FIG. 3. These voltages may have either a positive or negative polarity. Under low Q conditions, when the coil is close to the object, the loop gain including the amplifier at operating point Q, the positive feedback network and resonant circuit 12 is not adequate to sustain oscillation. If an amplifying device having a much higher linear gain as shown by curve 203 is used, the direct current offset voltages $E_2$ and $E_3$ may be sufficient to bias the amplifier out of the linear region as shown by operating point P. Therefore, in order to sustain oscillations, the amplitude of the initial transient disturbance must be great enough to intersect the linear region of operation. If, however, the amplitude of the initial transient is not of such amplitude as to intersect the linear region of operation, the circuit will not oscillate. This condition is aggravated in the case where the inductance 14 is adjacent the conductive object 18 and the "Q" of the tuned circuit is extremely low.

In accordance with the present invention, this condition is eliminated by virtue of high loop gain at oscillation frequency as exemplified by curve 203 and, the low frequency, essentially direct current negative feedback path which causes the amplifier to be biased at point R on characteristic 203, which is at or near the center of the high gain linear region, where an extremely small transient disturbance can initiate oscillations which will be sustained, even though they are of extremely low amplitude.

Figure 4:
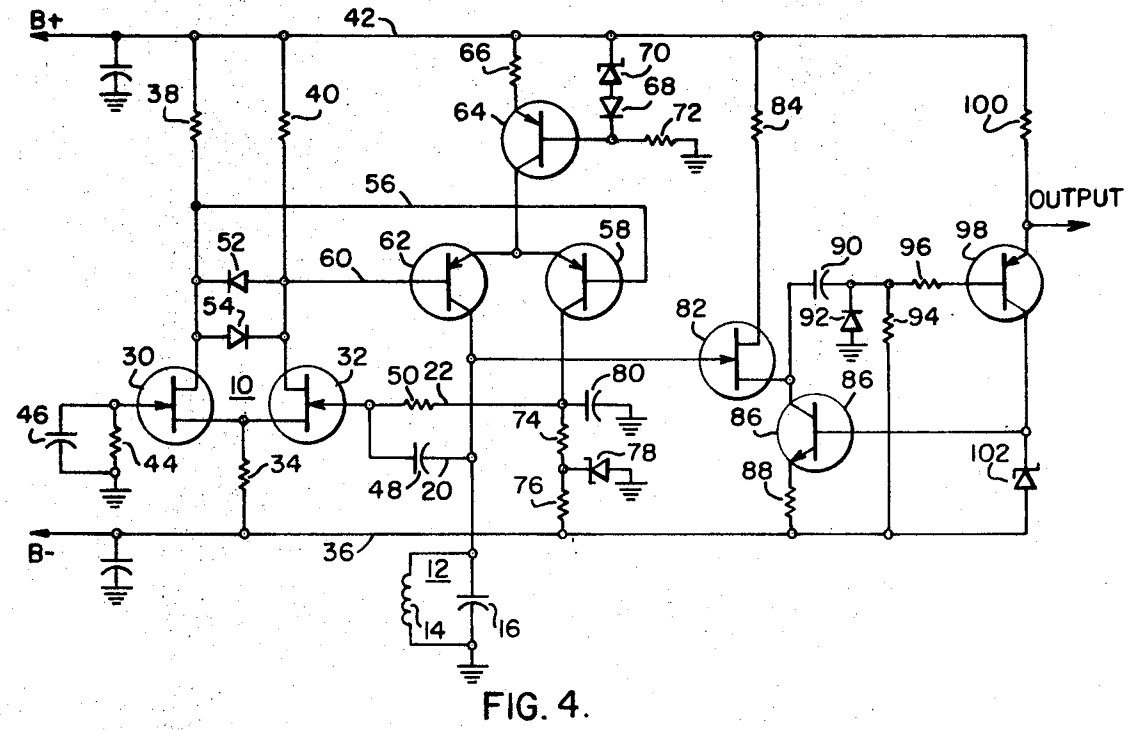
FIG. 4 is a schematic circuit diagram of one embodiment of the invention incorporating a differential amplifying device utilizing field effect transistors.

One specific embodiment of the invention is shown in FIG. 4 where the inductance and capacitance of the tuned circuit 12 are again indicated by the reference numerals 14 and 16, respectively. The amplifier 10 is of the differential type including field-effect transistors 30 and 32 having their source electrodes connected through a common resistor 34 to a source of B− potential on lead 36. The drain electrodes of the field-effect transistors 30 and 32 are connected through resistors 38 and 40 to a source of B+ potential on lead 42. A source of reference potential is established on the gate electrode of the field effect transistor by means of resistor 44 connected to ground, the resistor 44 being in shunt with a capacitor 46. The gate electrode of field-effect transistor 32, on the other hand, is connected to the two feedback paths 20 and 22, the high-frequency positive feedback path including capacitor 48 and the low frequency, essentially direct current feedback path including resistor 50. The drain electrodes of the two field-effect transistors 30 and 32 are interconnected by means of diodes 52 and 54 which limit the amplitude of the output signal in the positive and negative directions.

The drain electrode of field-effect transistor 30 is connected through lead 56 to the base of a first switching transistor 58. Similarly, the drain electrode of field-effect transistor 32 is connected through lead 60 to the base of a second switching transistor 62. The emitters of the two transistors 58 and 62 are connected through the collector and emitter of transistor 64 and resistor 66 to the source of B+ potential on lead 42. Transistor 64 acts as a constant current source and has its base connected through diode 68 and a Zener diode 70 to the B+ voltage source on lead 42. The base of transistor 64 is also connected to ground through resistor 72 as shown.

The collector of transistor 58 is connected to the B− voltage source on lead 36 through resistors 74 and 76, the junction of these resistors being connected to ground through Zener diode 78. The collector of transistor 58 is also connected to ground through capacitor 80 which acts to shunt to ground the radio frequency (i.e., high frequency) components in the signal appearing at the collector of transistor 58, leaving only the low frequency, essentially direct current component which is applied as a negative feedback signal through resistor 50 to the gate of field-effect transistor 32.

The collector of the other switching transistor 62, on the other hand, is connected through the tuned circuit 12 to ground. The signal appearing at the collector of transistor 62 is applied through capacitor 48 as a positive feedback signal to the base of transistor 32.

The quality factor, Q, of the tuned circuit 12 can be defined as:

$$Q=R/\omega L$$

where R is the equivalent parallel resistance of the tank circuit and L is the inductance of inductor 14. The voltage appearing across the tank circuit 12, therefore, and that applied between the gate and source electrodes of the field-effect transistor 32 is:

$$E=I(Q\omega L)$$

since the current I through the tank circuit is constant and since the quantity $\omega L$ is also a constant, it can readily be appreciated that the voltage E across the tank circuit will vary as a function of the quality factor, Q; and this, in turn, varies in direct proportion to the distance between the inductor 14 and a conductive object, such as object 18 in FIG. 1. Thus, as the distance D is varied, so also is the voltage applied to the gate electrode of field-effect transistor 32. Furthermore, by virtue of the negative feedback via path 22, the quiescent voltage condition on the gate electrode of field-effect transistor 32 is always such as to insure that even a very minor transient disturbance will initiate oscillations. The differential amplifier arrangement 10 is utilized in the circuit of FIG. 4, as well as the matched transistors 58 and 62, for temperature compensation purposes.

The signal on the collector of transistor 62, comprising an oscillatory signal having an amplitude proportional to the distance between the inductor in the tuned circuit and an adjacent conductive object, is applied to the gate electrode of field-effect transistor 82 having its drain electrode connected through resistor 84 to the B+ voltage source on lead 42. The source electrode of field-effect transistor 82 is connected through transistor 86, acting as a constant current source, and resistor 88 to the B− voltage source on lead 36.

The field-effect transistor 82 operates as a source follower, and has its source electrode connected through capacitor 90 and diode 92 to ground. Elements 90 and 92 act as a demodulator and produce a direct current signal across resistor 94 which varies in magnitude as a function of the amplitude of the oscillations produced on the collector of transistor 62. This direct current signal is applied through resistor 96 to the base of an emitter follower transistor 98 having its emitter connected to the B+ voltage source on lead 42 through resistor 100 and its collector connected through Zener diode 102 to the B− voltage source on lead 36. The Zener diode, which has its cathode connected to the base of transistor 86, establishes a bias for the constant current source transistor 86. The output appearing at the emitter of transistor 98, therefore, will be a direct current signal whose magnitude varies in direct proportion to the quality factor, Q, of tuned circuit 12 which, in turn, is a function of the distance between the inductor 14 and an adjacent conductive object, such as object 18 in FIG. 1. In the case of a vibrating body, the direct current output at the emitter of transistor 98 will vary sinusoidally.

Figure 5:
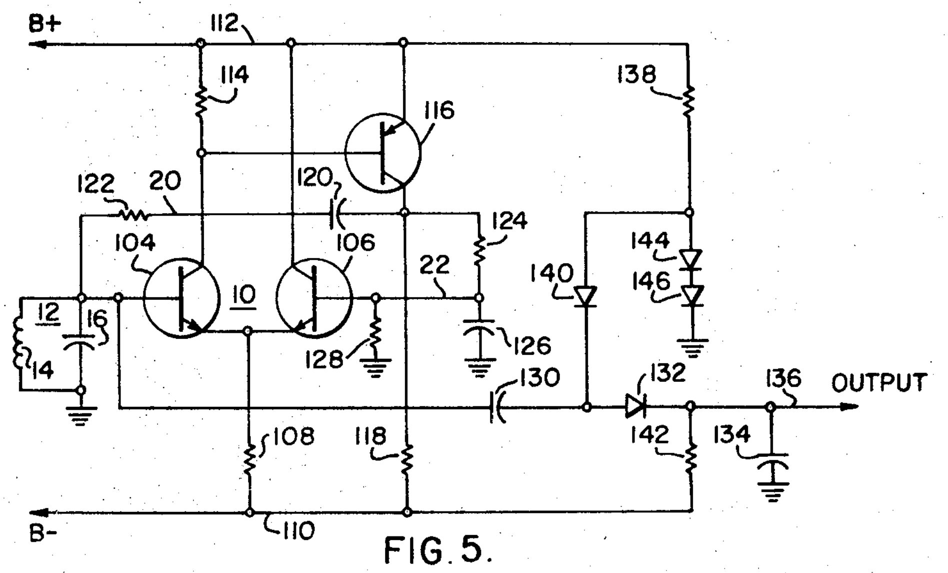
FIG. 5 is a schematic circuit diagram of another embodiment of the invention utilizing transistor elements in a differential amplifier arrangement.

With reference to FIG. 5, an alternative embodiment of the invention is shown and again includes the tuned circuit 12 including inductor 14 and capacitor 16. The amplifier 10 is again of the differential type, including transistors 104 and 106 having their emitters connected through a common resistor 108 to a source of B− potential on lead 110. The collector of transistor 106 is connected directly to a source of B+ potential on lead 112; while the collector of transistor 104 is connected through resistor 114 to the same lead 112. Signals appearing on the collector of transistor 104 are applied to the base of switching transistor 116 having its emitter connected to the lead 112 and its base connected to the source of B− potential on lead 110 via resistor 118.

Signals appearing on the collector of transistor 116 are applied back to the base of transistor 104 through positive feedback path 20 including capacitor 120 and resistor 122. The negative feedback path 22 is also connected to the collector of transistor 116 through resistor 124. High frequency signals are shunted to ground in the negative feedback path through capacitor 126. The resulting low frequency, essentially direct current negative feedback voltage appearing across resistor 128 is applied to the base of transistor 106.

The output signal, proportional in amplitude to the distance between the inductor 14 and an adjacent conductive body is taken from the base of transistor 104 and applied through capacitor 130 to a rectifying diode 132 which operates in conjunction with a smoothing capacitor 134. The resulting direct current voltage, proportional to the distance between the inductor 14 and a conductive body, appears at output terminal 136. The diode 132 is included in a voltage divider including resistor 138, diode 140 and resistor 142 connected between leads 110 and 112. The junction of resistor 138 and diode 140 is connected to ground through diodes 144 and 146 as shown.

As will be understood, the feedback through positive feedback path 20 to the base of transistor 104 provides regeneration at the resonant frequency of the tuned circuit 12. The negative feedback to the base of transistor 106 on feedback path 22 is to insure oscillations for the entire range as shown in FIG. 2 and insures that the oscillator starts even when the spacing between the coil 14 and an adjacent conductive object is very small. Since the resistance of the inductor 14 is low, very little direct current positive feedback is obtained through feedback path 20. However, the substantial direct current negative feedback to the base of transistor 106 insures that the three-stage amplifier will be biased in the linear region at turn ON. The loop gain at high frequencies is sufficient so that the oscillation will start if biased in the linear region. Thus, starting is insured even if the inductor 14 is in contact with a conductive body. The transistor 116, a switching transistor, is driven from saturation to cut off at all times, thus providing a constant current source to the tuned circuit 12 as was the case in the embodiment shown in FIG. 4.

Although the invention has been shown in connection with certain specific embodiments, it will be readily apparent to those skilled in the art that various changes in form and arrangement of parts may be made to suit requirements without departing from the spirit and scope of the invention.

We claim as our invention:

1. In electrical sensing apparatus, the combination of an oscillatory circuit including an amplifying device, a tuned circuit for said amplifying device, an inductance in said tuned circuit adapted to be placed in close proximity to a metallic object whose distance from the inductance is to be determined, a positive feedback path for said amplifying device connected to said tuned circuit, and a negative feedback path for said amplifying device for insuring that said amplifying device will be in its linear region of operation at all times and will support oscillations.

2. The electrical sensing apparatus of claim 1 including means for eliminating high-frequency signal components in said negative feedback path, having only a low frequency, essentially direct current signal.

3. The electrical sensing apparatus of claim 2 wherein said means for eliminating comprises a capacitor connecting said negative feedback path to ground.

4. The electrical sensing apparatus of claim 1 wherein said tuned circuit includes both said inductor and a capacitor.

5. The electrical sensing apparatus of claim 1 wherein said amplifying device comprises a pair of electron valves connected to a differential amplifier configuration.

6. The electrical sensing apparatus of claim 3 wherein said electron valves are provided with control electrodes and said positive and negative feedback paths are connected to the control electrode of only one of said electron valves.

7. The electrical sensing apparatus of claim 1 wherein said electron valves are provided with control electrodes, said positive feedback path being connected to one of said control electrodes and said negative feedback path being connected to the other of said electrodes.

8. The electrical sensing apparatus of claim 6 wherein said electron valves comprise field-effect transistors.

9. The electrical sensing apparatus of claim 7 wherein said electron valves comprise transistors.

10. The electrical sensing apparatus of claim 1 wherein said tuned circuit is connected to a switched constant current source whereby the positive feedback voltage in said positive feedback path will vary linearly with the Q of said tuned circuit.

11. The electrical sensing apparatus of claim 1 including rectifier means for demodulating oscillations produced by said oscillatory circuit.